United States Patent
O'Brien et al.

(10) Patent No.: US 9,762,258 B2
(45) Date of Patent: Sep. 12, 2017

(54) MISMATCH AND INTER SYMBOL INTERFERENCE (ISI) SHAPING USING DYNAMIC ELEMENT MATCHING

(71) Applicant: University of Limerick, Limerick (IE)

(72) Inventors: Vincent O'Brien, Gort (IE); Brendan Mullane, Newcastlewest (IE); Tony Scanlan, Riverbank (IE)

(73) Assignee: UNIVERSITY OF LIMERICK, Limerick (IE)

( * ) Notice: Subject to any disclaimer, the term of this patent is extended or adjusted under 35 U.S.C. 154(b) by 0 days.

(21) Appl. No.: 15/221,028

(22) Filed: Jul. 27, 2016

(65) Prior Publication Data

US 2017/0033802 A1    Feb. 2, 2017

Related U.S. Application Data

(60) Provisional application No. 62/198,282, filed on Jul. 29, 2015.

(51) Int. Cl.
*H03M 3/00* (2006.01)

(52) U.S. Cl.
CPC ........... *H03M 3/422* (2013.01); *H03M 3/458* (2013.01)

(58) Field of Classification Search
CPC .............................. H03M 3/422; H03M 3/458
USPC ................................... 341/143, 118
See application file for complete search history.

(56) References Cited

U.S. PATENT DOCUMENTS

| | | | | |
|---|---|---|---|---|
| 7,486,210 B1 * | 2/2009 | Hong | .................. | H03M 1/0665 341/50 |
| 8,144,043 B2 * | 3/2012 | Risbo | .................. | H03M 7/3006 341/143 |

* cited by examiner

*Primary Examiner* — Khai M Nguyen
(74) *Attorney, Agent, or Firm* — Loza & Loza, LLP; Anthony G. Smyth (57) ABSTRACT

The invention to mismatch and ISI shaping in a data converter. The invention provides a dynamic element matching technique that incorporates both mismatch and inter symbol interference shaping. A digital decoder is provided that controls the number of 'on' and 'off' transitions so that the resulting signal does not contain noise or distortion. The element selection technique of the invention is suitable for high resolution multi-bit continuous time oversampling data converters.

15 Claims, 4 Drawing Sheets

Figure 1

(a) Ideal pulse no ISI error     (b) Actual pulse $\delta_{n,i} \neq \delta_{f,i}$

MISMATCH AND INTER SYMBOL INTERFERENCE (ISI) SHAPING USING DYNAMIC ELEMENT MATCHING

CROSS-REFERENCE TO RELATED APPLICATIONS

This application claims priority to and the benefit of provisional patent application No. 62/198,282, titled, "Mismatch And Inter Symbol Interference (ISI) Shaping Using Dynamic Element Matching" and filed in the U.S. Patent Office on Jul. 29, 2015, the entire content of which is incorporated herein by reference for all purposes.

FIELD

The application relates to mismatch and ISI shaping in a data converter.

BACKGROUND

Sigma Delta A/D and D/A converters that employ multi-level DACs have numerous advantages over those using single bit. Increased stability, more aggressive noise transfer function and the additional quantizer bits lead to a large increase in the SNR performance. In addition, the requirements of any reconstruction filter following a multi-bit DAC is significantly relaxed when compared to single bit. For converters with multi-bit quantizers, the linearity of the DAC must match or exceed that of the overall converter to avoid degradation of the signal. Achieving high levels of linearity requires strict matching of the analog components; in practice matching of these analog components is limited by systematic and random effects that occur during circuit fabrication.

Implementing sigma delta and oversampling converters in the continuous time domain offer several advantages over the discrete time equivalent. In the case of continuous time sigma delta ADCs, the loop filter can be implemented using continuous time integrators; these can act as an anti-aliasing filter removing the need for additional filtering. In discrete time digital to analog converters, the switched capacitor analog reconstruction filter required at the output is limited by kT/C noise. However, moving to a continuous time implementation avoids this limitation. While continuous time solutions offer many advantages over discrete time implementations, it is important to note they require a continuous time DAC. This means that in addition to the amplitude mismatch error, mismatches in the rise and fall times of the DAC elements switching 'on' and 'off' lead to another error source known as Inter Symbol Interference (ISI).

Mismatch error is the process whereby random and systematic errors occur during the fabrication of the DAC elements. When the DAC elements are summed to form the DAC output, these errors appear as noise and distortion at the output. ISI error occurs due to a mismatch between the rise and fall times of the DAC elements. This leads to a process by which the current value of a DAC element is affected by the previous value of the element. This altering of element values results in distortion at the output of the DAC. Like mismatch error, ISI error reduces the DACs ability to convert a signal faithfully by adding noise and distortion at the output.

Conventional solutions to reduce inter symbol interference (ISI) error involve the use of DAC coding schemes namely return to zero (RTZ) and dual return to zero (DRTZ), as disclosed in N. Khiem, R. Adams, and K. Sweetland, "A 113 dB SNR oversampling sigma-delta DAC for CD/DVD application," *Consumer Electronics, IEEE Transactions on*, vol. 44, pp. 1019-1023, 1998. In RTZ, the output of the digital to analog converter (DAC) is returned to zero at each conversion cycle; while this mitigates the ISI error, the scheme is very sensitive to clock jitter and introduces sharp transitions in the DAC output which have to be filtered by the subsequent circuitry. The DRTZ scheme uses two sub RTZ DACs operating in parallel, their outputs which are 180 degrees out of phase are summed together to form a single DAC output. Unlike RTZ coding, DRTZ maintains the DAC output amplitude and avoids the sharp transitions and increased clock jitter sensitivity. Although this scheme eliminates the ISI error, it requires twice the number of DAC elements and an accurate clocking scheme.

An analog based solution to ISI error was proposed in N. Khiem, A. Bandyopadhyay, B. Adams, K. Sweetland, and P. Baginski, "A 108 dB SNR, 1.1 mW Oversampling Audio DAC With A Three-level DEM Technique," *Solid-State Circuits, IEEE Journal of*, vol. 43, pp. 2592-2600, 2008; in this method the settled output of the DAC is sampled using a track and hold circuit. This effectively avoids the ISI error, but the solution requires additional analog sampling circuitry and can introduce the problem of aliasing of high frequency noise into the signal band.

In S. Tao, R. Schreier, and F. Hudson, "Mismatch shaping for a current-mode multibit delta-sigma DAC," *Solid-State Circuits, IEEE Journal of*, vol. 34, pp. 331-338, 1999 a Modified Mismatch Shaper (MMS) is presented, the authors use a dynamic element matching (DEM) scheme where the number of elements switching 'on' and 'off' is set to a constant value; this has the effect of turning the ISI error into a DC offset. The drawback of this technique is that it places a restriction limiting the output range of the modulator.

In J. De Maeyer, P. Rombouts, and L. Weyten, "Addressing static and dynamic errors in bandpass unit element multibit DAC's," in *Circuits and Systems, 2004. ISCAS '04. Proceedings of the 2004 International Symposium on*, 2004, pp. I-345-I-348 Vol. 1 and J. De Maeyer, P. Rombouts, and L. Weyten, "Addressing static and dynamic errors in unit element multibit DACs," *Electronics Letters*, vol. 39, pp. 1038-1039, 2003; the authors present a DEM algorithm which ensures that DAC elements cannot be used for consecutive conversion cycles. While this method is effective at mitigating the mismatch error, it requires twice the number of DAC elements and hence is a sub-optimal use of the available redundancy.

In L. Risbo, R. Hezar, B. Kelleci, H. Kiper, and M. Fares, "Digital Approaches to ISI-Mitigation in High-Resolution Oversampled Multi-Level D/A Converters," *Solid-State Circuits, IEEE Journal of*, vol. 46, pp. 2892-2903, 2011 and L. Risbo, R. Hezar, B. Kelleci, A. Bjoern-Josefsen, "Shaping inter-symbol-interference in sigma-delta converter", US patent 2011/0267210, the authors present a DEM scheme that combines ISI and mismatch error shaping. This scheme seeks to shape the mismatch error by using the element usage history and the ISI error by filtering the element transition density. While this scheme provides an improvement over the state of the art, it suffers from tonal distortion as the input signal amplitude increases due to its inability to directly control the number of element transitions during each DAC conversion cycle. In A. Sanyal, L. Chen, and N. Sun, "Dynamic Element Matching With Signal-Independent Element Transition Rates for Multibit $\Delta\Sigma$ Modulators," *Circuits and Systems I: Regular Papers, IEEE Transactions on*, vol. 62, pp. 1325-1334, 2015, the authors present a mismatch shaping technique that controls the number of element transitions so that they are independent of the input signal. The scheme allows the instantaneous number of transitions to vary among three adjacent integers $L\pm 1$ so that they are no longer correlated with the input signal. A noise shaping loop chooses the number of transitions from these adjacent integers resulting in the ISI error being shaped. This scheme improves state of the art, however the ISI shaping produces tonal distortion for which dither logic is required to remove.

It is therefore an object to provide a system and method to solve the problem of Inter Symbol Interference (ISI) and mismatch error in a data converter.

SUMMARY

There is provided, as set out in the appended claims, a data converter comprising a digital decoder configured to control a number of 'on' and 'off' transitions of an input signal such that an output signal does not contain inter symbol interference and mismatch error.

The data converter provides a digital solution to the problem of Inter Symbol Interference (ISI) and mismatch error within a DAC.

In one embodiment the invention provides a DEM scheme that combines both mismatch and ISI error shaping that allows for high resolution signals to be produced in the presence of both mismatch and ISI. The scheme operates by controlling the element transitions so that they are not correlated with the input signal. The scheme uses the available redundancy in the DAC to shape the mismatch and ISI error out of band without requiring twice the number of elements, or placing a severe restriction on the modulator signal as with prior art schemes. Furthermore, the scheme exhibits increased ISI shaping performance and a reduction in distortion tones when compared to alternative solutions.

Advantages are:

Provides a digital solution to the problem of ISI error which makes the design more portable and scalable with IC design process technology nodes.

The solution provides the best suppression of ISI error over current state of the art solutions.

The proposed solution can be used to mitigate other effects such as switching transients and glitches.

The proposed solution can mitigate ISI error without requiring twice the number of elements that other solutions require.

The proposed solution avoids sharp transitions on the DAC output which other ISI reduction schemes have.

The proposed solution does not require additional analog circuitry.

The proposed solution exhibits greater immunity to distortion components at higher signal amplitudes when compared to current state of the art techniques.

The proposed solution does not require dither to break up unwanted tones appearing in the spectrum due to ISI shaping compared to other ISI reduction schemes.

The proposed solution directly controls the transition of the elements ensuring that the ISI error is shaped out of band.

The proposed solution calculates the available transitions for each DAC code, from the available transitions it selects a sequence of transitions that provides optimal suppression of the ISI error.

In one embodiment the decoder is configured to control the transitions such that the transitions are not correlated with the input signal.

In one embodiment the decoder is adapted to select the number of elements that contribute to the output signal for a conversion cycle.

In one embodiment the digital decoder is configured to select the maximum number of 'on' transitions when the rate of change of the input signal is most positive.

In one embodiment the digital decoder is configured to select the minimum number of 'on' transitions when the rate of change of the input signal is most negative.

In one embodiment the digital decoder is configured to select the minimum number of 'off' transitions when the rate of change of the input signal is most positive.

In one embodiment the digital decoder is configured to select the maximum number of 'off' transitions when the rate of change of the input signal is most negative.

In one embodiment there is provided a transition shaper circuit.

In one embodiment the transition shaper circuit is configured to select a sequence of 'on' transitions that is formed by taking a first order difference of the input signal on each cycle to which a constant value C is added.

In one embodiment the transition shaper circuit is configured to select a sequence of 'on' transitions that is formed by taking a first order difference of the input signal on each cycle to which a constant value C is added and wherein the 'off' transitions can be set to a constant C.

In one embodiment the transition shaper circuit is configured to select a sequence of 'off' transitions that is formed by taking a first order difference of the input signal on each cycle to which a constant value C is added.

In one embodiment the transition shaper circuit is configured to select a sequence of 'off' transitions that is formed by taking a first order difference of the input signal on each cycle to which a constant value C is added and wherein the 'on' transitions can be set to a constant C.

In one embodiment the transition shaper circuit comprises an ISI shaper module configured to determine the number of elements to turn 'on' and 'off' and a mismatch shaper module configured to determine which elements to turn 'on' and 'off'.

In one embodiment there is provided a high pass filter adapted to suppress errors at low frequencies around a band of interest.

In one embodiment there is provided a digital decoder for use in a data converter configured to control a number of 'on' and 'off' transitions of an input signal such that an output signal does not contain inter symbol interference and mismatch error.

There is also provided a computer program comprising program instructions for causing a computer program to carry out the above method which may be embodied on a record medium, carrier signal or read-only memory.

BRIEF DESCRIPTION OF THE DRAWINGS

The invention will be more clearly understood from the following description of an embodiment thereof, given by way of example only, with reference to the accompanying drawings, in which:

FIGS. 7(*a*) and 7(*b*) illustrates two circuits that can be used to select the appropriate number of transitions ($T_n$);

DETAILED DESCRIPTION OF THE DRAWINGS

Figure 1:
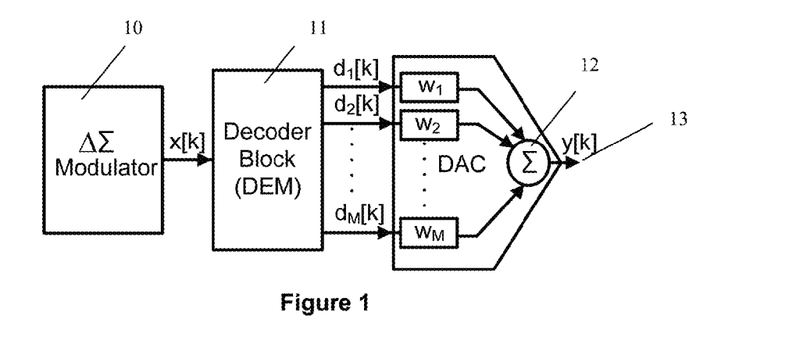
FIG. 1 illustrates a DAC signal flow according to one embodiment of the invention.

FIG. 1 shows a signal flow for a Digital to Analog Converter (DAC) in a noise shaping converter, 10. The output x[k] of the noise shaper 10 is mapped to a set of M 1-bit signals as given by Equation (1), where $d_i$ denotes the $i^{th}$ 1-bit signal, indexed from 1 to M where M is the number of elements in the DAC. Each element in the DAC is assigned a weight $w_i$, which are then summed to form the output of the DAC y[k] as given by Equation (2).

$$x[k] = \sum_{i=1}^{M} d_i[k] \quad d_i \in \{0, 1\} \tag{1}$$

$$y[k] = \sum_{i=1}^{M} d_i[k] w_i \tag{2}$$

During each DAC conversion cycle, a decoder 11 selects the number of DAC elements to turn 'on'. Each time an element is turned 'on' it forms a pulse with an amplitude, $w_i$ these pulses are then summed 12 to form the final DAC output 13. In a discrete time DAC, only the settled value of the pulse amplitude is summed.

Figure 2:
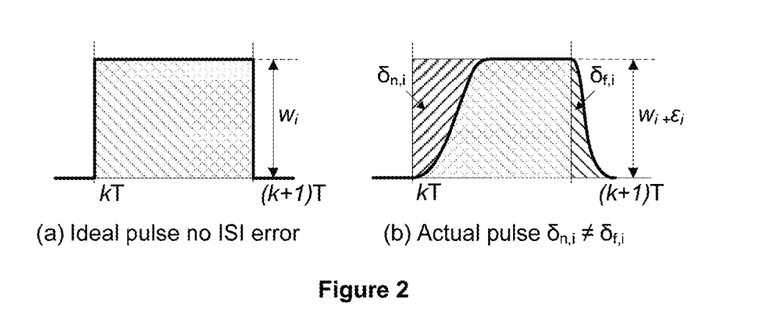
FIG. 2 illustrates Inter Symbol Interference (ISI) error for a single pulse.
Figure 3:
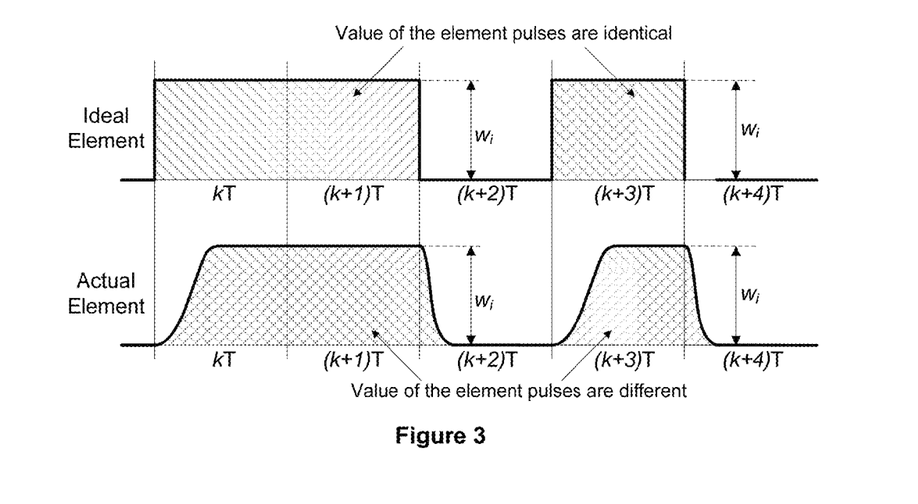
FIG. 3 illustrates graphical waveforms of ISI error.

In continuous time DACs however, the DAC output is formed by summing the integrated values of the element pulses. This means that the value of the pulse over the entire conversion cycle is important. If the DAC element is assumed to turn 'on' and 'off' instantly, then the resulting pulse will have edges that are infinitely sharp. In this case the value of the DAC pulse remains the same irrespective of whether the element was previously 'on' or 'off'. In a real system however, the DAC elements will have a finite rise time and fall time. This is illustrated in FIG. 2 where an error term is assigned to the rising and falling edges of the DAC. These error terms are used to represent the departure of the actual DAC pulse from the ideal DAC pulse. A difference in the magnitude of these errors will result in the value of the DAC pulse being dependant on whether the DAC element was 'on' or 'off' during the previous conversion cycle. This is illustrated in FIG. 3. The resulting error is commonly known as inter symbol interference (ISI) error, which leads to noise and distortion at the output 13 of the DAC.

Figure 4:
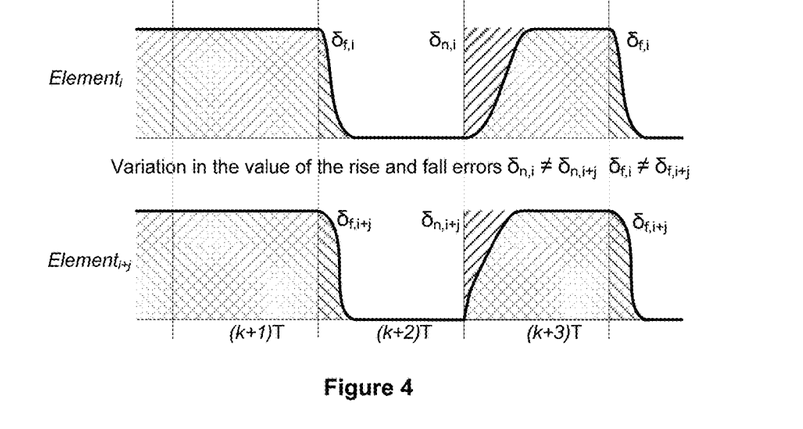
FIG. 4 illustrates transition mismatch error.

An additional source of error termed transition mismatch error can be attributed to the transitioning of the DAC elements. This error arises due to variations in the values of the rise and fall errors between elements, this transition mismatch error is illustrated in FIG. 4.

In one embodiment there is provided a digital solution that removes the effects of ISI and mismatch error from the signal band. In one embodiment the solution is a module with a number of computer implemented instructions or an algorithm that can be implemented using standard digital logic. An advantage of the digital implementation is that the solution can be scaled more easily with shrinking geometry nodes, making it attractive for CMOS implementations. In addition, the technique does not have the associated drawbacks of analog solutions such as the requirement for linear switches and accurate capacitor sizes. In comparison to traditional layout techniques that aim to mitigate the ISI problem by ensuring the error on the elements is minimized; the scheme of the present invention has an advantage of allowing the DAC to select elements such that the associated errors are removed from the signal band. This means that the invention facilitates the DAC to accurately convert high resolution signals in the presence of both ISI and mismatch error.

In addition, the solution does not require special manipulation of the DAC elements during fabrication which has the further advantage of making the layout task easier. The data converter of the invention does not require doubling the number of elements as is the case in dual return to zero (DRTZ) DACs. This provides a significant improvement in terms of DAC area and power consumed. The solution improves on other digital techniques used for shaping mismatch and ISI by directly controlling the number of elements that transition within a window of available transitions; this provides for more effective shaping of ISI and mismatch error leading to the proposed technique achieving higher performance when compared to other state of the art methods.

The invention removes both the mismatch and ISI error that is present at the output of the DAC by shaping the errors out of band. This is achieved by implementing a decoder that controls both the number of elements that transition and which elements are selected during each DAC conversion cycle.

In one embodiment the solution is a digital decoder that controls the DAC operation in four ways:

1. The decoder selects the number of elements that contribute to the DAC output for each conversion cycle.
2. The decoder selects which elements are turned 'on' and 'off' so that the mismatch on these elements is shaped out of band.
3. The decoder deterministically selects the number of elements that transition on each conversion cycle shaping the ISI error to the same performance as the modulator input.
4. The decoder controls which elements to turn 'on' and 'off' at each conversion cycle so that the transition mismatch error is shaped out of band.

Figure 5:
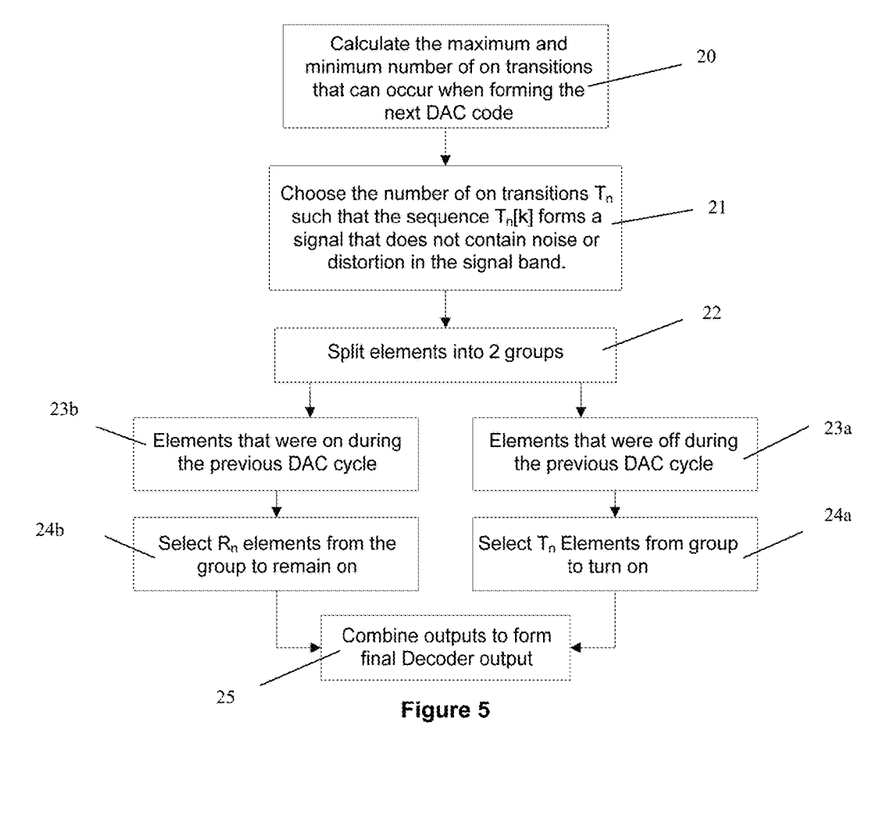
FIG. 5 illustrates a flowchart of a decoder algorithm according to one embodiment.

The flow chart in FIG. 5 illustrates the operation of the decoder. The decoder algorithm can be broken down into a number of processes:

1. Calculation of available transitions—In step 20 an algorithm uses the mathematical equations (3~6) to calculate the available number of 'on' and 'off' transitions for each conversion cycle. By defining $T_{n,max}$, $T_{n,min}$, $T_{f,max}$, and $T_{f,min}$ the algorithm can determine all the available 'on' and 'off' transitions.

$$T_{n,max}[k] = \begin{cases} M - x[k-1] & \text{if } x[k] + x[k-1] > M \\ x[k] & \text{if } x[k] + x[k-1] \le M \end{cases} \tag{3}$$

$$T_{n,min}[k] = \begin{cases} x[k] - x[k-1] & \text{if } x[k] > x[k-1] \\ 0 & \text{if } x[k] \le x[k-1] \end{cases} \tag{4}$$

$$T_{f,max}[k] = \begin{cases} M - x[k] & \text{if } x[k] + x[k-1] > M \\ x[k-1] & \text{if } x[k] + x[k-1] \le M \end{cases} \tag{5}$$

Figure 6:
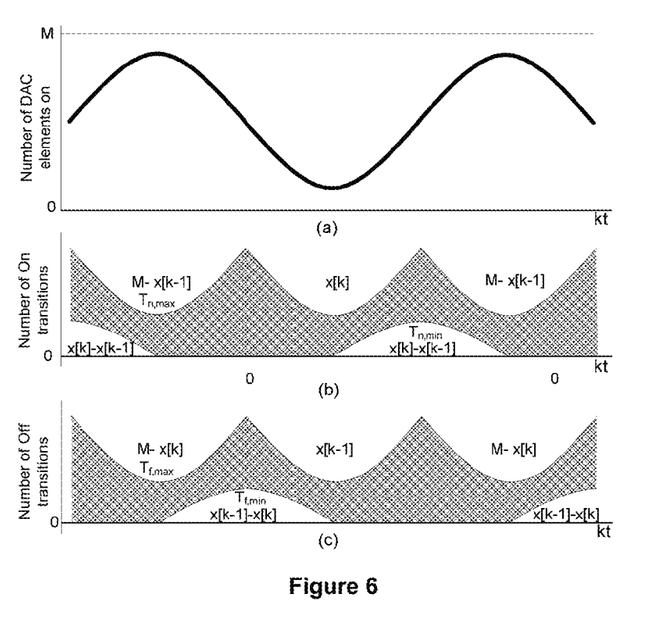
FIG. 6 illustrates a graphical representation of available 'on' and 'off' transitions.

-continued $$T_{f,min}[k] = \begin{cases} x[k-1] - x[k] & \text{if } x[k-1] > x[k] \\ 0 & \text{if } x[k-1] \le x[k] \end{cases} \quad (6)$$

Where $T_{n,max}$ is the maximum number of 'on' transitions, $T_{n,min}$ is the minimum number of 'on' transitions, $T_{f,max}$ is the maximum number of 'off' transitions and $T_{f,min}$ is the minimum number of 'off' transitions. FIG. 6 is a graphical representation of the available 'on' and 'off' transitions.

2. Choosing the number of transitions—In step 21, the algorithm is configured to deterministically select the number of transitions that occur during each conversion cycle of the DAC. The algorithm can be used to exert explicit control over either the 'on' or 'off' transitions resulting in the mitigation of the ISI error. In one embodiment the algorithm controls the number of 'on' transitions denoted by $T_n$ that occur during each conversion cycle. The value $T_n$ will be chosen from the available transitions as defined in step 1. The decoder must choose $T_n$ such that the sequence of $T_n$ over time forms a signal that does not contain noise or distortion in the signal band. The decoder then generates a second signal $R_n$ by subtracting $T_n$ from the number of elements required to be 'on'. This signal represents the number of elements that are to remain 'on' during the conversion cycle.

It should be noted that exerting control over either the 'on' or 'off' transitions in the above manner will result in the ISI error being shaped. A further embodiment of the algorithm could equally control the 'off' transitions to shape ISI error.

3. Selection of elements—On each cycle, the decoder splits the elements into two groups in step 22. The first group contains the elements that were 'off' in the previous conversion cycle 23a. From this group the decoder selects $T_n$ of these elements to be turned 'on' while keeping the remaining elements in the group 'off' in step 24a. The second group contains the elements that were 'on' during the previous DAC conversion cycle in step 23b. The decoder now selects $R_n$ of these elements to remain 'on' and sets the remaining elements in the group to be 'off' in 24b. The decoder then combines the output of both selections to form the final decoder output in step 25.

It is important to note that while the decoder is restricted in the number of elements to turn 'on', and the number of elements to remain 'on', it has freedom in the choice of which elements within the group to select as long as the number of them selected is correct. To this extent the decoder can be combined with existing mismatch and transition error shaping algorithms. In this manner the decoder can be extended to provide suppression of mismatch and ISI error along with transition mismatch error.

Generation of Transition Signal

The function of the algorithm is to generate a sequence of 'on' transitions that does not contain distortion or noise in the signal band. The decoder does this by seeking to maximize the number of 'on' transitions when the rate of change of the signal is most positive and minimize the number of 'on' transitions when the rate of change of the signal is most negative. To achieve this, the decoder must choose the number of 'on' transitions from the set of available transitions. When the required number of 'on' transitions is different from those available, the decoder will choose the closest value from the set of 'on' transitions. The resulting error introduced into the sequence is fed back through a high pass filter. The objective of this filtering is to suppress the error at low frequencies around the band of interest.

Figure 7A:
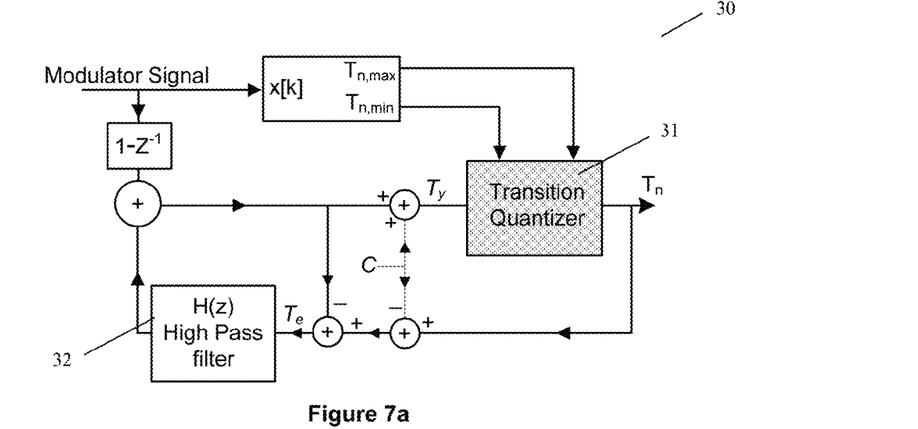

To generate the appropriate sequence of transitions, a circuit as proposed in FIG. 7(*a*) is used indicated generally by the reference numeral 30 configured to act as a transition shaper circuit. This transition shaper circuit 30 is similar to a conventional error feedback modulator loop. The input signal to the transition shaper is the first order difference of the modulator signal. The maximum ($T_{n,max}$) and minimum ($T_{n,min}$) number of 'on' transitions is generated from the modulator signal by implementing equations (3) and (4). A modified quantizer 31 is used to select $T_n$ from the available 'on' transitions. A constant value C is added to the input signal to form the signal $T_y$ which is used as input to the modified quantizer 31 whose operation is governed by equation (7). In this manner the decoder ensures that $T_n$ forms a signal that does not contain second or higher order distortion components. In addition, any error that occurs due to the difference between the available 'on' transitions and the first order difference of the signal plus the constant C will be high pass filtered by filter 32; this means that the error will be suppressed at low frequencies close to the signal band and pushed to higher frequencies away from the band of interest.

$$T_n = \begin{cases} T_{n,max} & \text{if } T_y \ge T_{n,max} \\ T_{n,min} & \text{if } T_y \le T_{n,min} \\ T_y & \text{otherwise} \end{cases} \quad (7)$$

Figure 7B:
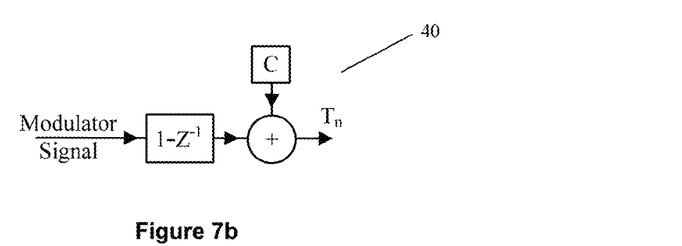

FIG. 7(*a*) shows the signal flow diagram of the circuit used to select the appropriate number of transitions ($T_n$). By extension, a simplified version of the method to choose the transitions is represented by FIG. 7(*b*), indicated by the reference numeral 40. The sequence of 'on' transitions is formed by taking the first order difference of the input signal on each cycle to which a constant value C is added. The 'off' transitions can be subsequently set to a constant C.

Selection of Elements

Figure 8:
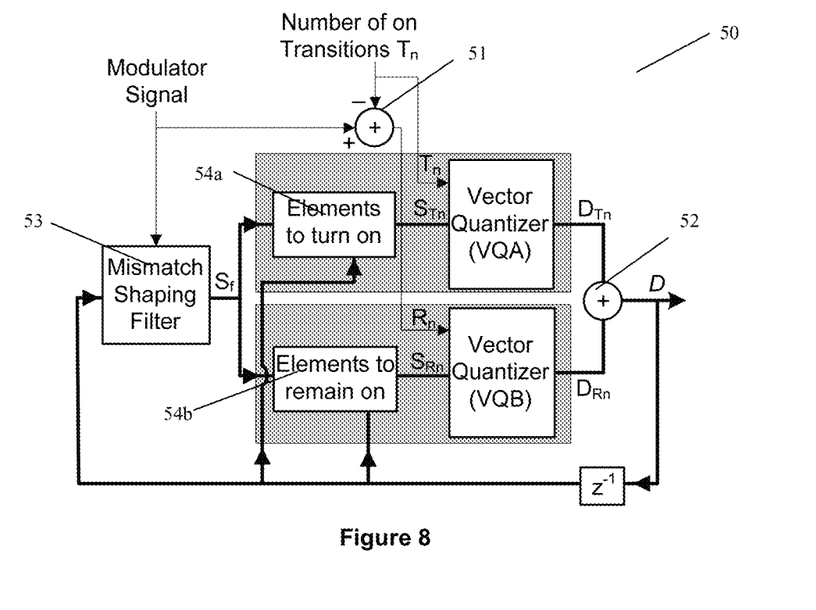
FIG. 8 illustrates a signal flow diagram for combining both ISI and Mismatch shaper design.

This section describes the selection of the elements so that the mismatch and ISI error is shaped out of band. To achieve this, a mismatch and ISI shaping loop as shown in FIG. 8, indicated by the reference numeral 50. At each cycle the ISI shaper splits 51 the modulator signal x[k] into two signals; $T_n$ representing the number of elements to turn 'on' and $R_n$ representing the number of elements to remain 'on' where $R_n[k]=x[k]-T_n[k]$. For each conversion cycle, a Vector Quantizer A (VQA) sets $T_n$ values in vector $D_{Tn}$ to 1. Similarly a Vector Quantizer B (VQB) sets $R_n$ values in vector $D_{Rn}$ to 1. The output vector of a decoder D, 52 is formed by the summation of $D_{Tn}$ and $D_{Rn}$. VQA only chooses to turn 'on' elements that were previously 'off' and similarly VQB only chooses to keep 'on' elements that were previously 'on'. These VQA & VQB actions are ensured by a feedback loop containing the element selection vector D, 53 which is used to select the appropriate signals.

Logic blocks 54a and 54b separate the vector output of the mismatch shaping filter $S_f$ into two signals; $S_{Tn}$ which contains the $S_f$ values pertaining to the elements that are currently 'off' and so become available to be turned 'on';

and $S_{Rn}$ which contains the $S_f$ values of the elements that are currently 'on' and are available to remain 'on'. VQA chooses which elements in vector $D_{Tn}$ to set to 1 with preference given to the elements in vector $D_{Tn}$ with the largest corresponding values in the vector $S_{Tn}$. Likewise VQB chooses which elements in vector $D_{Rn}$ to set to 1 based on the values contained in $S_{Rn}$. In summary the ISI shaper determines the number of elements to turn 'on' and 'off' and the mismatch shaper determines which elements to turn 'on' and 'off'. This combined operation results in both mismatch and ISI shaping.

Figure 9:
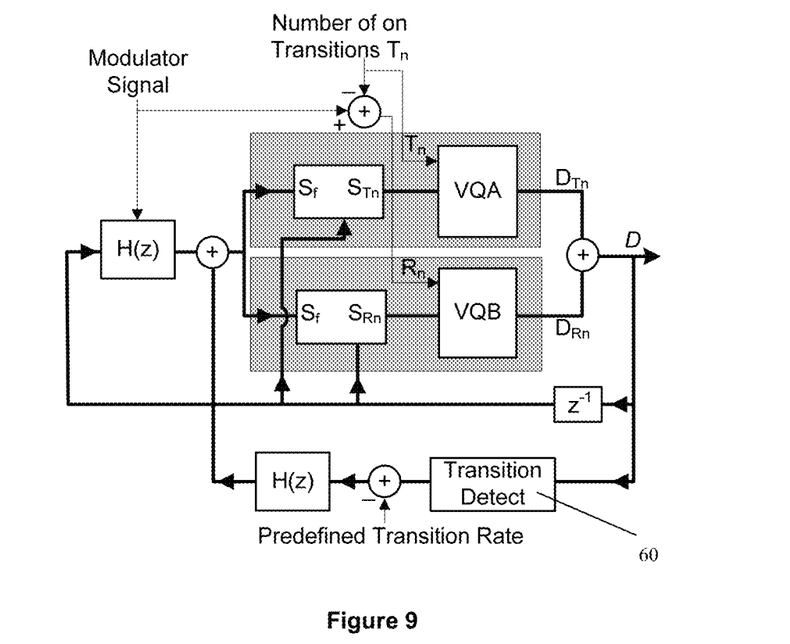
FIG. 9 illustrates an extended mismatch and ISI shaping loop to incorporate ISI error shaping and transition mismatch error shaping.

To provide shaping of the transition mismatch error, a second loop can be added to the system as shown in FIG. 9, which is similar to FIG. 8. The loop accumulates the transition density of each element using a transition detector module 60. The transition density is defined as the number of transitions that occur over time. The loop attempts to keep the transition density of each element constant. In addition to this, it will seek to shape any deviation between the actual element transition density and the predefined transition density. This action has the effect of shaping transition mismatch error. By combining this loop with the ISI shaper described previously the decoder can now select the element transitions such that the transition error is shaped out of band.

Results

To demonstrate the effectiveness of the proposed technique, a model of a data converter as shown in FIG. 1 is used. This model comprises of a Sigma Delta modulator 10, a decoder 11, and a DAC 12. Without any error present on the DAC 12, the converter achieves a SINAD figure of 100 dB and SFDR figure of 114 dB.

To simulate the inaccuracies present on a real DAC, randomly distributed errors are added to each DAC element. These errors are illustrated in FIG. 2b where $\epsilon_1$ represents the mismatch error, $\delta_{ni}$ represents the error on the rising edge of the element, and $\delta_{fi}$ represents the error on the falling edge of the DAC element. The values of the errors are scaled with respect to a unit element value. The mismatch error ($\epsilon_i$) is set to represent a deviation of 1% of the unit element value. With respect to the ISI error the difference in magnitude between the error on the rising edge ($\delta_{ni}$) and error on the falling ($\delta_{fi}$) edge of the elements is scaled to 1% of the unit element value. The transition mismatch error is scaled to 0.1% of the unit element value. Table 1 compares the SINAD and SFDR performance of a thermometer decoder, $1^{st}$ order mismatch shaper, and the proposed mismatch and ISI shaper for the error values specified in the table. Table 1 illustrates the performance of the ISI error mitigation and Mismatch shaper invention performance with error values specified.

It will be appreciated that the invention provides a dynamic element matching technique that incorporates both mismatch and inter symbol interference shaping. The element selection technique of the invention is suitable for high resolution multi-bit continuous time oversampling converters. The algorithm extends the ability of conventional mismatch shaping selection logic by deterministically controlling the element transitions the DAC makes in response to an input signal. Utilizing this new technique, the dynamic element matching logic can spectrally shape both element mismatch error and the rise & fall time errors commonly known as inter symbol interference (ISI). This technique results in a reduction in DAC non-linearity and achieves an increase in SNR/SINAD/SNDR without the need for strict matching of the DAC elements.

The invention presents a design of a DEM decoder that provides optimal ISI error mitigation and is suitable for shaping both ISI and mismatch error. The algorithm hereinbefore described controls the number of 'on' transitions such that they are maximized when the rate of change of the signal is most positive and minimized when it is most negative.

Alternatively, another embodiment controls the number of 'off' transitions such that they are minimized when the rate of change of the signal is most positive and maximized when it is most negative. In addition to this, a noise shaping loop ensures that any error that occurs as a result of this transition selection will be shaped out of band. The algorithm can be extended to shape both the mismatch error and the transition error The results show that since the technique controls the number of transitions from the available window of transitions while also shaping the individual elements, it achieves the best performance in the presence of both mismatch and ISI errors when compared to prior art techniques.

In the context of the present invention it should be noted that while the description has focused on oversampling and noise shaping converters, the proposed DEM scheme is not strictly limited to this class of converter. This technique can be applied to any class of converter that possesses redundancy in terms of both the signal bandwidth and DAC element permutations.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a memory stick or hard

TABLE 1

| | | MM 1% | ISI 0% | TE 0.0% | MM 0% | ISI 1% | TE 0.0% | MM 1% | ISI 1% | TE 0.0% | MM 1% | ISI 1% | TE 0.1% |
|---|---|---|---|---|---|---|---|---|---|---|---|---|---|
| Thermometer Decoder | SINAD | 63 dB | | | 82 dB | | | 62 dB | | | 59 dB | | |
| | SFDR | 65 dB | | | 98 dB | | | 64 dB | | | 61 dB | | |
| $1^{st}$ Order Mismatch Shaper | SINAD | 96 dB | | | 47 dB | | | 47 dB | | | 47 dB | | |
| | SFDR | 105 dB | | | 49 dB | | | 49 dB | | | 49 dB | | |
| Mismatch & ISI Shaper | SINAD | 90 dB | | | 100 dB | | | 90 dB | | | 90 dB | | |
| | SFDR | 103 dB | | | 114 dB | | | 103 dB | | | 101 dB | | |

MM: Mismatch Error
ISI: Intersymbol interference error
TE: Transition Error disk. The carrier may be an electrical or optical signal which may be transmitted via an electrical or an optical cable or by radio or other means.

In the specification the terms "comprise, comprises, comprised and comprising" or any variation thereof and the terms include, includes, included and including" or any variation thereof are considered to be totally interchangeable and they should all be afforded the widest possible interpretation and vice versa.

The invention is not limited to the embodiments hereinbefore described but may be varied in both construction and detail.

The invention claimed is:

1. A data converter comprising:
    a digital decoder configured to control a plurality of 'on' and 'off' transitions of an input signal such that an output signal does not contain inter symbol interference and mismatch error; and
    a transition shaper circuit wherein the transition shaper circuit is configured to select a sequence of 'on' transitions that is formed by taking a first order difference of the input signal on each conversion cycle to which a constant value C is added.

2. The data converter of claim 1 wherein the decoder is configured to control the transitions such that the transitions are not correlated with the input signal.

3. The data converter of claim 1 wherein the decoder is adapted to select a plurality of elements that contribute to the output signal for a conversion cycle.

4. The data converter of claim 1 wherein the digital decoder is configured to select a maximum number of 'on' transitions available for each conversion cycle when rate of change of the input signal is positive.

5. The data converter of claim 1 wherein the digital decoder is configured to select a minimum number of 'on' transitions available for each conversion cycle when rate of change of the input signal is negative.

6. The data converter of claim 1 wherein the digital decoder is configured to select a minimum number of 'off' transitions available for each conversion cycle when rate of change of the input signal is positive.

7. The data converter of claim 1 wherein the digital decoder is configured to select a maximum number of 'off' transitions available for each conversion cycle when rate of change of the input signal is negative.

8. The data converter of claim 1 wherein the transition shaper circuit is configured to select a sequence of 'on' transitions that is formed by taking a first order difference of the input signal on each cycle to which a constant value C is added and wherein the 'off' transitions can be set to a constant C.

9. The data converter of claim 1 wherein the transition shaper circuit is configured to select a sequence of 'off' transitions that is formed by taking a first order difference of the input signal on each cycle to which a constant value C is added.

10. The data converter of claim 1 wherein the transition shaper circuit is configured to select a sequence of 'off' transitions that is formed by taking a first order difference of the input signal on each cycle to which a constant value C is added and wherein the 'on' transitions can be set to a constant C.

11. The data converter of claim 1 wherein the transition shaper circuit comprises an ISI shaper module configured to determine a number of elements to turn 'on' and 'off' and a mismatch shaper module configured to determine which elements to turn 'on' and 'off'.

12. A Digital to Analog Converter comprising a data converter as claimed in claim 1.

13. A digital decoder for use in a data converter as claimed in claim 1, and configured to control a number of 'on' and 'off' transitions of an input signal such that an output signal does not contain inter symbol interference and mismatch error.

14. A data converter comprising:
    a digital decoder configured to control a plurality of 'on' and 'off' transitions of an input signal such that an output signal does not contain inter symbol interference and mismatch error; and
    a high pass filter adapted to supress errors at low frequencies around a band of interest.

15. A data converter comprising:
    a digital decoder configured to control a plurality of 'on' and 'off' transitions of an input signal such that an output signal does not contain inter symbol interference and mismatch error,
    wherein the digital decoder is configured to combine an ISI and Mismatch shaper with a second feedback loop to shape transition mismatch errors out of band.

* * * * *